(12) United States Patent
Batterywala et al.

(10) Patent No.: US 7,260,797 B2
(45) Date of Patent: Aug. 21, 2007

(54) METHOD AND APPARATUS FOR ESTIMATING PARASITIC CAPACITANCE

(75) Inventors: Shabbir H. Batterywala, Bangalore (IN); Narendra Shenoy, Cupertino, CA (US); Madhav Desai, Powai Mumbai (IN)

(73) Assignee: Synopsys, Inc., Mountain View, CA (US)

(*) Notice: Subject to any disclaimer, the term of this patent is extended or adjusted under 35 U.S.C. 154(b) by 417 days.

(21) Appl. No.: 10/935,765

(22) Filed: Sep. 7, 2004

(65) Prior Publication Data

US 2006/0053394 A1    Mar. 9, 2006

(51) Int. Cl.
G06F 9/45       (2006.01)
G06F 17/10      (2006.01)
G06G 7/56       (2006.01)

(52) U.S. Cl. .............. 716/5; 716/1; 716/2; 716/4; 716/9; 703/2; 703/5; 703/14

(58) Field of Classification Search ............ 716/4, 716/5, 9, 15; 714/776; 713/194; 703/2, 703/5, 14; 702/57; 438/323
See application file for complete search history.

(56) References Cited

U.S. PATENT DOCUMENTS

| | | | |
|---|---|---|---|
| 4,599,722 A * | 7/1986 | Mortimer | 714/776 |
| 4,997,786 A * | 3/1991 | Kubota et al. | 438/480 |
| 6,285,957 B1 * | 9/2001 | Tanaka et al. | 702/57 |
| 6,330,704 B1 * | 12/2001 | Ljung et al. | 716/5 |
| 6,353,801 B1 * | 3/2002 | Sercu et al. | 702/65 |
| 6,606,586 B1 * | 8/2003 | Ishikawa | 703/5 |
| 6,895,344 B2 * | 5/2005 | Ramaswamy | 702/57 |
| 6,895,372 B1 * | 5/2005 | Knebel et al. | 703/14 |
| 7,149,666 B2 * | 12/2006 | Tsang et al. | 703/2 |
| 2002/0002683 A1 * | 1/2002 | Benson et al. | 713/194 |
| 2002/0040466 A1 * | 4/2002 | Khazei | 716/9 |
| 2002/0142149 A1 * | 10/2002 | Nakashima et al. | 428/323 |
| 2004/0268287 A1 * | 12/2004 | Toh | 716/15 |
| 2005/0120316 A1 * | 6/2005 | Suaya et al. | 716/4 |
| 2005/0198599 A1 * | 9/2005 | Sercu et al. | 716/4 |

* cited by examiner

Primary Examiner—Jack Chiang
Assistant Examiner—Helen Rossoshek
(74) Attorney, Agent, or Firm—Park, Vaughan & Fleming, LLP

(57) ABSTRACT

One embodiment of the present invention provides a system for estimating parasitic capacitance for an integrated circuit. During operation, the system reads a technology file, which describes the composition of a vertical cross-section of the integrated circuit. Next, the system reads a design file, which specifies the layout of the integrated circuit. The system then identifies a set of dielectric configurations based on information contained in the technology file. It then computes Green's function for each of these configurations. Next, the system estimates a parasitic capacitance using information contained in the design file and using the set of Green's functions.

24 Claims, 4 Drawing Sheets

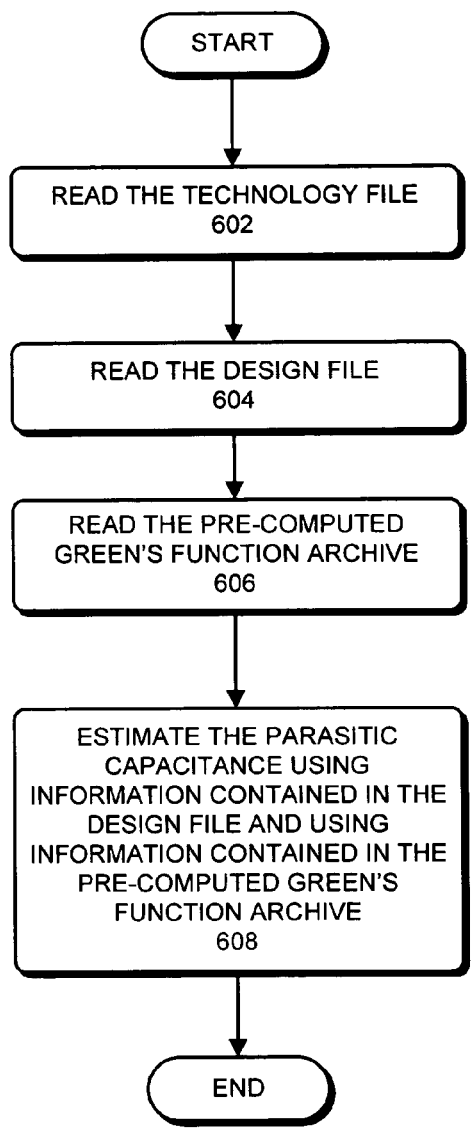
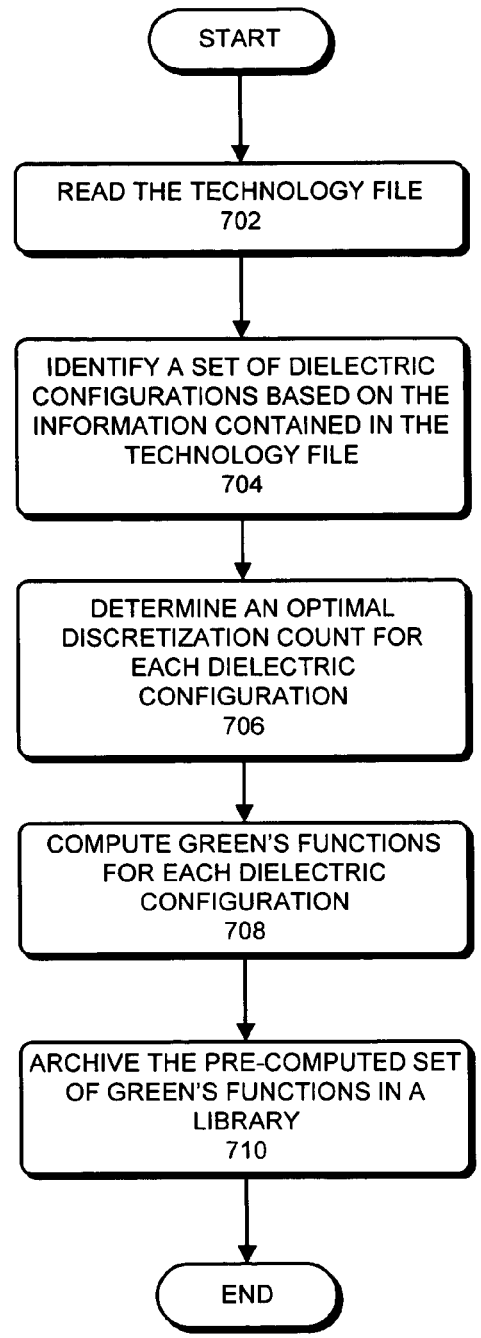
FIG. 6
FIG. 7

METHOD AND APPARATUS FOR ESTIMATING PARASITIC CAPACITANCE

BACKGROUND

1. Field of the Invention

The present invention relates to the process of estimating capacitance in an integrated circuit. More specifically, the present invention relates to the process of estimating parasitic capacitance in an integrated circuit by using a set of Green's functions.

2. Related Art

Throughout recent history, the relentless miniaturization of integrated circuits has been a key driving force behind technological innovation. Today, integrated circuits are being built at deep sub-micron (DSM) dimensions. At these dimensions, accurate estimation of parasitic capacitances has become absolutely critical for performing any subsequent timing or signal integrity analyses.

Parasitic capacitances, which could previously be extracted using simplified methods, are now more difficult to compute because of the increased effect of fringe capacitances at small dimensions. Moreover, since miniaturization is expected to continue, accurate estimation of parasitic capacitance is expected to become even more critical in the future.

Hence, there is a pressing need to use sophisticated three-dimensional (3-D) methods for extracting capacitances for integrated circuits. However, it is well known that 3-D methods require large processing times and many of these methods do not scale well. Hence, 3-D methods have typically been used for estimating capacitances for small to medium sized integrated circuits.

3-D methods can broadly be classified into Finite Element Method (FEMs), Fast Multipole Methods (FMMs), Boundary Element Methods (BEMs) and statistical methods. All of these methods compute capacitance by solving fundamental electrostatic equations, albeit using different numerical techniques. Moreover, in all of these methods, capacitances are computed indirectly by evaluating a charge integral.

In particular, FEM-based methods evaluate the charge integral by discretizing the entire volume of the integrated circuit and then solving the resultant linear system. BEM-based methods only discretize the conductor boundaries and dielectric interfaces. Even though this approach reduces the size of the resultant linear systems, they still result in large linear systems. Both FEMs and BEMs are computationally infeasible to solve for large integrated circuits. Hence, these methods are useful only for computing capacitances for small to medium sized integrated circuits.

FMM-based methods use efficient heuristics to reduce the size of the linear systems generated by the BEM-based methods, thereby facilitating their applicability to larger integrated circuits. Still these methods are infeasible to solve large integrated circuits.

In contrast, statistical methods can be used for estimating capacitance for large integrated circuits. Instead of discretizing volumes or boundaries, statistical methods estimate the capacitance by statistically sampling the integrand in the charge integral. Since statistical methods do not discretize volumes or boundaries, they can be used to estimate the capacitance for large integrated circuits without significantly increasing the processing time.

Unfortunately, present statistical methods for estimating capacitances suffer from two main drawbacks. First, present statistical methods tend to be inefficient if the integrated circuit contains multiple layers of dielectrics. Nowadays, it is common to have three or more layers of dielectrics between conductors in an integrated circuit. Hence, it is not practical to use existing statistical methods to estimate capacitance. Second, existing statistical methods have slower convergence properties and tend to report capacitance estimates with larger variance in given computation time. To get capacitance estimates with smaller variance requires large amount of computational time. Since the subsequent timing or signal integrity analyses is highly sensitive to the accuracy of the estimated capacitance, having a large variance in the estimated capacitance can have a detrimental effect in these subsequent analyses.

Hence what is needed is a method and apparatus for accurately and efficiently estimating the parasitic capacitance in a large integrated circuit with multiple dielectrics.

SUMMARY

One embodiment of the present invention provides a system for estimating parasitic capacitance for an integrated circuit. During operation, the system reads a technology file, which describes the composition of a vertical cross-section of the integrated circuit. Next, the system reads a design file, which specifies the layout of the integrated circuit. The system then identifies a set of dielectric configurations based on information contained in the technology file. It then computes Green's function for each of these configurations. Next, the system estimates a parasitic capacitance using information contained in the design file and using the set of Green's functions.

In a variation on this embodiment, the system estimates the parasitic capacitance by first choosing a conductor within the integrated circuit. Next, the system constructs a Gaussian surface that contains the conductor, but does not contain any other conductor. The system then selects a set of locations on the Gaussian surface. Next, the system estimates the electric field at each location in the set of locations.

In a variation on this embodiment, the system estimates the electric field at a location by constructing a first cube that encloses the location. The first cube is constructed so that it can touch a conductor, but cannot contain a conductor. Moreover, the dielectric composition of the constructed first cube corresponds to a dielectric configuration for which an electric-field Green's function is available in the pre-computed set of Green's functions. Next, the system estimates the potential at one or more locations on the first cube's surface.

In a variation on this embodiment, the system estimates the electric potential at a location on the first cube's surface by constructing a second cube that encloses the location. The second cube is constructed so that it can touch a conductor, but cannot contain a conductor. Moreover, the dielectric composition of the constructed second cube corresponds to a dielectric configuration for which an electric-potential Green's function is available in the pre-computed set of Green's functions. Next, the system estimates the electric potential on a location on the second cube's surface.

In a variation on this embodiment, the three-dimensional layout of the integrated circuit is represented using an oct-tree variant that only allows two-way node splits, thereby facilitating efficient execution of geometric queries without using a large amount of storage space.

In a variation on this embodiment, constructing the Gaussian surface involves constructing a surface that is approximately equidistant from the enclosed conductor and the adjacent conductors.

In a variation on this embodiment, selecting a set of locations on the Gaussian surface involves randomly choosing a location using a probability distribution function that mimics the behavior of the dot product between the normal vector and the electric field.

In a variation on this embodiment, the system selects locations on the Gaussian surface by first stratifying the cross product of points on the Gaussian surface and points on the surface of the first hop cube into multiple strata, so that the variation in the value of the dot product between the normal vector and the electric-field Green's function that corresponds to the dielectric composition of the cube is minimized within each stratum. Next, the system selects a plurality of locations within each stratum.

In a variation on this embodiment, the constructed first cube that encloses a location in the set of locations is the largest possible cube such that it can touch a conductor, but cannot contain a conductor. Moreover, the dielectric composition of the constructed cube corresponds to a dielectric configuration for which an electric-field Green's function is available in the pre-computed set of Green's functions.

In a variation on this embodiment, the constructed second cube that encloses a location on the first cube's surface is the largest possible cube such that it can touch a conductor, but cannot contain a conductor. Moreover, the dielectric composition of the cube corresponds to a dielectric configuration for which an electric-potential Green's function is available in the pre-computed set of Green's functions.

One embodiment of the present invention provides a system for identifying a set of Green's functions for a fabrication technology. During operation, the system reads a technology file, which describes the composition of a vertical cross-section of an integrated circuit manufactured using the fabrication technology. Next, the system identifies a set of dielectric configurations which are sufficient for the efficient execution of random walks. Each dielectric configuration is composed of two dielectrics. In a variation on this embodiment, dielectric configuration with more than two dielectrics are also identified. Collectively, the set of dielectric configurations covers all possible dielectric configurations which can be encountered during the execution of random walks.

In a variation on this embodiment, the system pre-computes Green's functions for the identified dielectric configurations. The system also computes various multiple dielectric configurations at plurality of locations in the design. Green's functions are also computed for these dielectric configurations. Next, the system archives this set of computed Green's functions by storing them in a library, thereby allowing a capacitance estimation process to quickly lookup the value of a Green's function that corresponds to the fabrication technology.

In a variation on this embodiment, pre-computing a set of Green's functions involves determining an optimal discretization count for each dielectric configuration in the set, thereby striking a balance between the amount of processing time and the amount of memory required for computing Green's function for each dielectric configuration at a plurality of locations.

In a variation on this embodiment, archiving the pre-computed set of Green's functions involves storing them in a binary file.

BRIEF DESCRIPTION OF THE FIGURES

FIG. 6 presents a flow chart that illustrates the process of estimating a parasitic capacitance in accordance with an embodiment of the present invention.

FIG. 7 presents a flowchart that illustrates the process of pre-computing and archiving a set of Green's functions for a plurality of locations in accordance with an embodiment of the present invention.

DETAILED DESCRIPTION

Vertical Cross-Section of an Integrated Circuit

Figure 1:
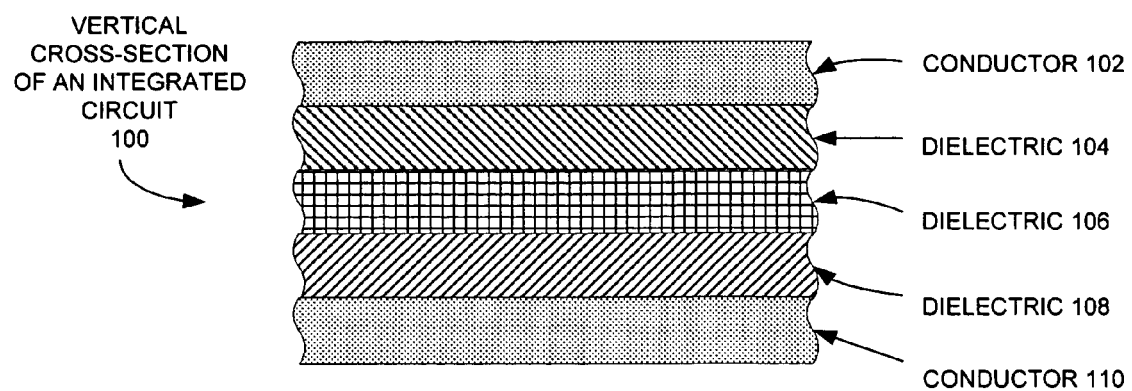
FIG. 1 illustrates the composition of a vertical cross-section of an integrated circuit in accordance with an embodiment of the present invention.

FIG. 1 illustrates the composition of a vertical cross-section of an integrated circuit 100 in accordance with an embodiment of the present invention.

Integrated circuit fabrication is a complex multiple-step sequence of predominantly chemical processing steps. Some of the chemical processing steps result in adding a layer of dielectric material to the composition of the integrated circuit. In today's processing technology, it is common to have three or more layers of dielectric material between the conductor layers.

Specifically, the processing steps can be grouped into two categories, namely, front-end processing steps and back-end processing steps.

Front-end processing steps typically involve preparation of the wafer surface, patterning and subsequent implantation of dopants to obtain the desired electrical properties, deposition of a gate dielectric, and deposition of insulating materials to isolate neighboring devices.

Back-end processing steps typically involve depositing various layers of conductors and insulating material in an intricate pattern. The various conductor layers are then interconnected by etching holes, called "vias" in the insulating material.

The vertical cross-section of the integrated circuit depicted in FIG. 1 contains two conductors 102 and 110 that are separated by three layers of dielectric material 104, 106, and 108. Note that the technology file contains information that describes the composition of a vertical cross-section of an integrated circuit.

Parasitic Capacitance

Figure 2:
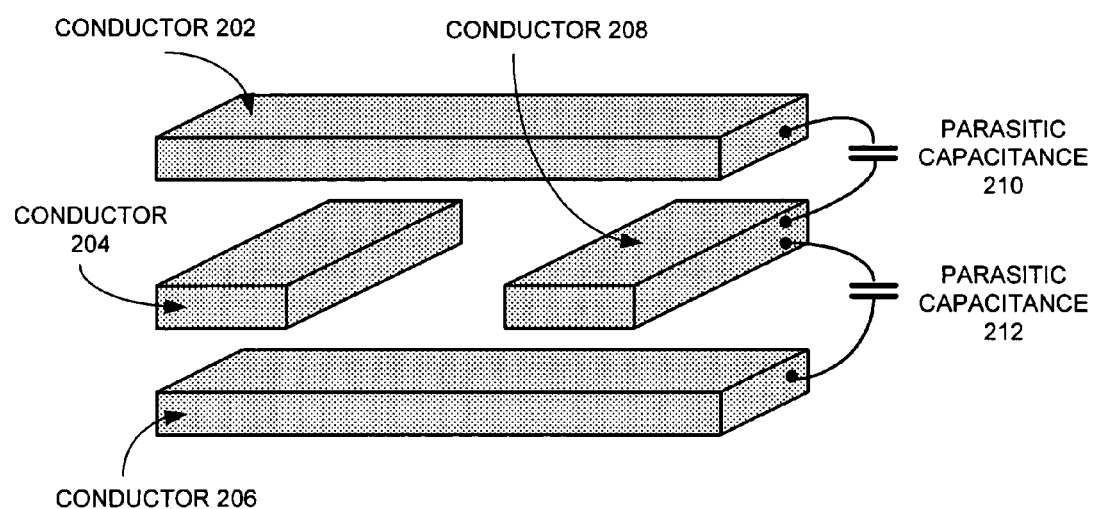
FIG. 2 illustrates parasitic capacitances in an integrated circuit that are created due to the three-dimensional layout of the conductors in accordance with an embodiment of the present invention.

FIG. 2 illustrates parasitic capacitances 210 and 212 in an integrated circuit that are created due to the three-dimensional layout of the conductors 202, 206, and 208, in accordance with an embodiment of the present invention.

Today, integrated circuits contain millions of individual components that need to be electrically connected to each other via conductors. The three-dimensional geometries of each component and conductor in the integrated circuit are usually specified in the design file. Each conductor, such as conductors 202, 204, 206, and 208, has a three-dimensional structure and is made of metal or polysilicon. Moreover, each conductor could be different in shape, thickness, and vertical distance from the substrate. Furthermore, each conductor, such as conductor 204, is typically surrounded in three-dimensions by a number of other conductors that are either on the same level, such as conductor 208, or on different levels, such as conductors 202 and 206.

Specifically, FIG. 2 illustrates four conductors 202, 204, 206, and 208 on three different levels that are in close proximity of each other. Note that, each pair of conductors 202, 204, 206, and 208 results in a parasitic capacitance. For example, the juxtaposition of conductor 202 and conductor 208 results in a parasitic capacitance 210. (Note that, for the sake of brevity, we have not enumerated all of the parasitic capacitances. For example, we do not show the parasitic capacitance between conductor 202 and 206.)

It is evident that the accurate estimation of these parasitic capacitances is a complicated task, which typically requires that the exact three-dimensional geometries be used for every portion of the conductor. Due to the complexity and the large size of today's integrated circuits, present techniques require an unacceptable amount of processing time for accurately estimating the parasitic capacitances.

Process of Estimating the Parasitic Capacitance

FIG. 6 presents a flow chart that illustrates the process of estimating a parasitic capacitance in accordance with an embodiment of the present invention.

The process begins by reading the technology file (step 602). The technology file describes the composition of a cross-section of the integrated circuit.

Next, the design file (step 604) that contains the three-dimensional layout of the integrated circuit is read. In one embodiment of the present invention, the three-dimensional layout of the integrated circuit is represented using a variant of an oct-tree data structure that only allows two-way node splits. In this manner, geometric queries can be executed efficiently without requiring a large amount of storage space.

Next, the system reads the pre-computed Green's function archive (step 606).

The parasitic capacitance is then estimated using information contained in the design file and using information contained in the pre-computed Green's function archive (step 608). Note that, the pre-computed Green's function archive contains the set of Green's functions that corresponds to the fabrication technology, which is described in the technology file.

Figure 3:
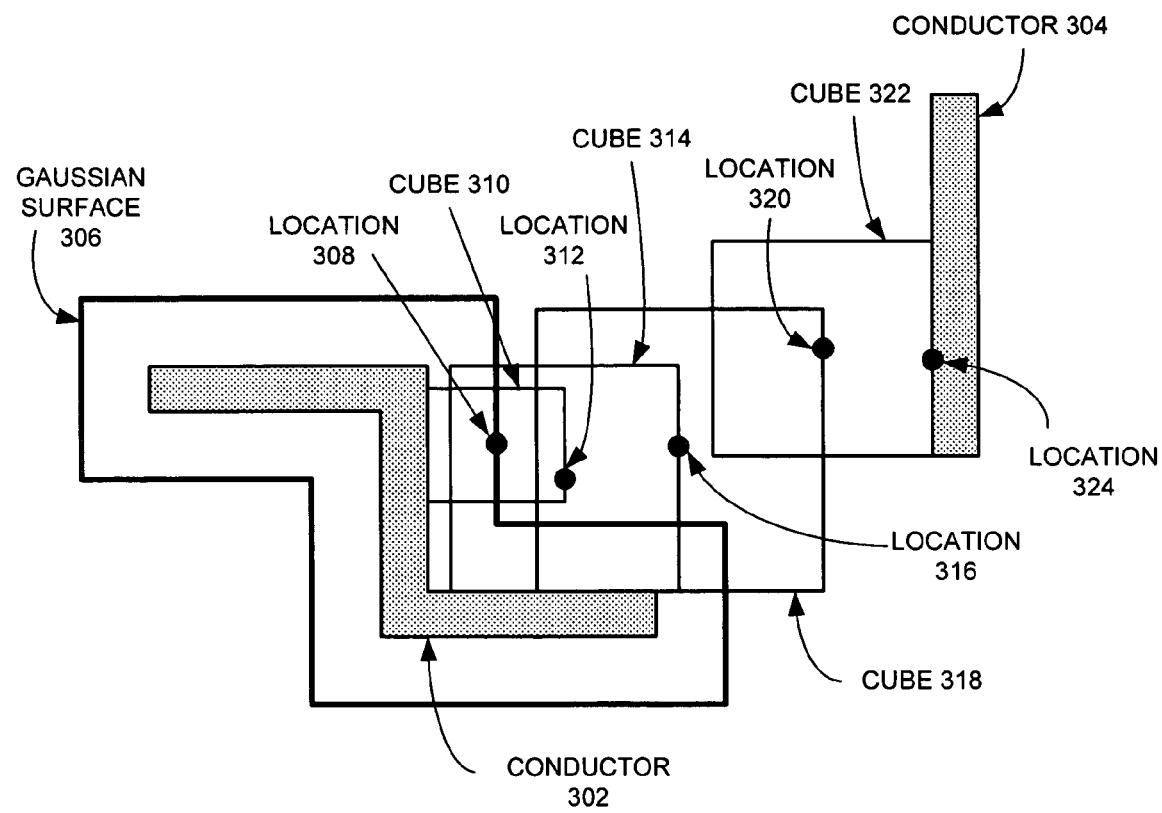
FIG. 3 illustrates the process of estimating the parasitic capacitance between two conductors in accordance with an embodiment of the present invention.

Specifically, FIG. 3 illustrates the process of estimating the parasitic capacitance between conductors 302 and 304. Note that, in the present invention, the capacitance is estimated using a statistical method called the Monte Carlo method that uses random walks for estimating the capacitance. (Note that, although the capacitance estimation process is a three-dimensional process, for the sake of clarity and ease of discourse, we will use two dimensional figures while explaining the process.)

First, a Gaussian surface 306 is constructed around conductor 302. Next, a location 308 is selected on the Gaussian surface 306. Note that, we can statistically estimate the parasitic capacitance between conductors 302 and 304 if we can determine the electric field at a plurality of locations, such as location 308, on Gaussian surface 306. In particular, the parasitic capacitance between conductors 302 and 304 can be estimated by sampling the dot product between the normal vector and the electric-field at a plurality of locations on the Gaussian surface 306. In one embodiment of the present invention, the Gaussian surface 306 is an arbitrary closed surface that completely encloses the conductor 302.

Note that, if we are unable to determine the electric field at location 308, a cube 310 is constructed around location 308. Note that cube 310 is constructed so that it does not contain a conductor, such as conductor 302, but it can touch a conductor. Furthermore, in one embodiment of the present invention, cube 310 is constructed so that its dielectric composition corresponds to a dielectric configuration for which an electric-field Green's function is available in the pre-computed set of Green's functions. Furthermore, in one embodiment of the present invention, the constructed cube 310 is a maximal cube, which is defined as the largest cube that has the following properties: (a) the cube can touch a conductor, but it cannot contain a conductor, and (b) the cube's dielectric composition corresponds to a dielectric configuration for which an electric-field Green's function is available in the pre-computed set of Green's functions. Additionally, in one embodiment of the present invention, the location 308 is at the center of the constructed cube 310. Furthermore, in one embodiment of the present invention, instead of a constructing a cube 310, an arbitrary closed surface is constructed around the location 308.

Next, a location 312 is selected on the cube 310 that encloses location 308. Note that, we can estimate the electric field at location 308 if we can determine the electric potential at all locations on the cube 310. Specifically, the electric field at location 308 can be estimated by sampling an electric-field Green's function at location 312 on the cube 310. Note that the electric-field Green's function is selected based on information contained in the technology file, which among other things, describes the composition of a cross-section of the integrated circuit. Furthermore, in one embodiment of the present invention, the electric field at location 308 is estimated by determining the electric potential at a plurality of locations, such as location 312, on the cube 310.

If we are unable to determine the electric potential at location 312, then a cube 314 is constructed around location 312. Next, a location 316 is selected on cube 314. Note that, we can estimate the electric potential at location 312 if we can determine the electric potential at all locations on the cube 314. Specifically, the electric potential at location 312 can be estimated by sampling an electric-potential Green's function at location 316 on the cube 314.

This process—that of recursively constructing a cube around a location and then randomly selecting a location on the cube's surface—is continued until the selected location is on the surface of a conductor. For example, if we cannot determine the potential at location 316, a cube 318 is constructed around location 316. Next, a location 320 is selected on cube 318. A cube 322, which touches conductor 304, is then constructed around location 320. Next, location 324 is selected on cube 322. Note that, since location 324 is on the surface of conductor 304, its electric potential is equal to the electric potential of the conductor, which is a known a priori.

Now, by working backwards, we can estimate the electric potentials at locations 320, 316, and 312, respectively. Furthermore, the electric potential at location 312 can be used for estimating the electric field at location 308, which in turn can be used for estimating the parasitic capacitance between conductors 302 and 304.

Note that, if the dot product between the normal vector and the electric field varies a lot on the Gaussian surface 306, it can result in a large variance in the estimated capacitance. For example, the electric field varies considerably near corners. Hence, to reduce the variance of the estimated capacitance, the Gaussian surface must be selected judiciously.

Figure 4:
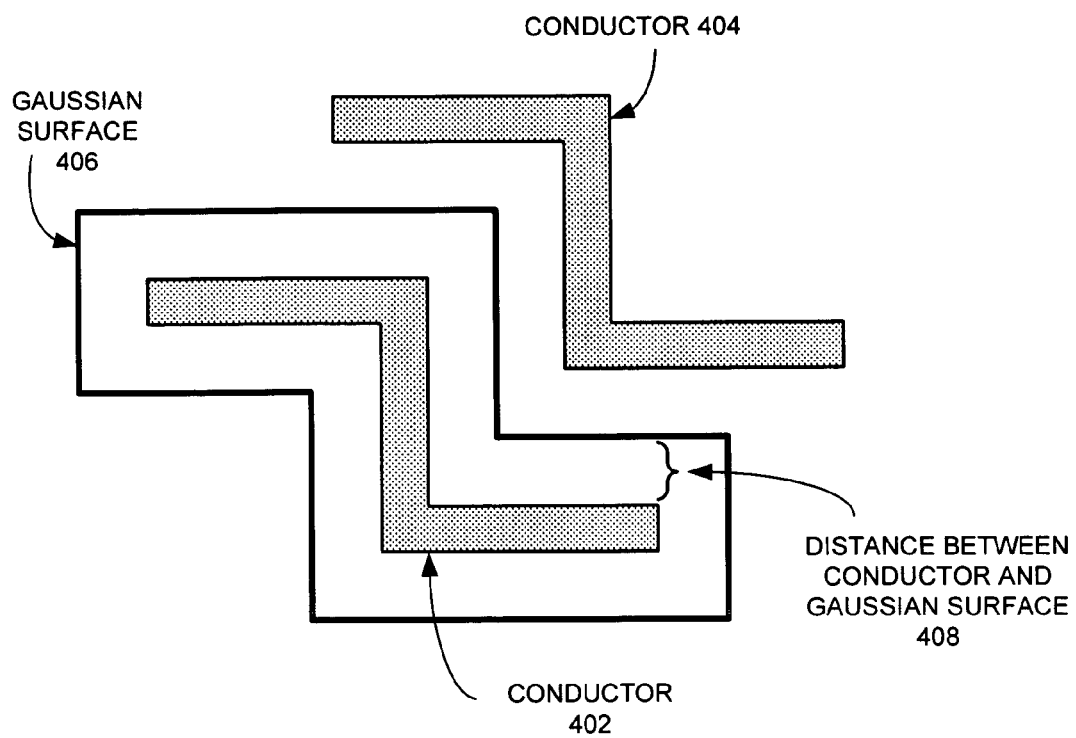
FIG. 4 illustrates how to judiciously select a Gaussian surface between two conductors in an integrated circuit in accordance with an embodiment of the present invention.

FIG. 4 illustrates how to judiciously select a Gaussian surface between two conductors 402 and 404 in an integrated circuit. In one embodiment of the present invention, the Gaussian surface 406 is selected so that it is approximately equidistant from the two conductors, namely, conductors 402 and 404. Since the Gaussian surface 406 is equidistant from conductors 402 and 404, the electric field is expected to be well behaved, which results in a smaller variance of the estimated capacitance. In the absence of this variance-reducing enhancement, the capacitance estimation process would have resulted in a larger variance of the estimated capacitance.

Furthermore, the variance in the estimated capacitance can be further reduced by sampling the locations on the Gaussian surface 406 using a probability distribution function that mimics the behavior of the dot product between the normal vector on the Gaussian surface 406 and the electric field.

In one embodiment of the present invention, the probability distribution function is inversely proportional to the distance between the conductor and the Gaussian surface 408. Specifically, the probability distribution function is equal to $A/D_x$, where A is a constant and $D_x$ is equal to the distance between the conductor and a location, x, on the Gaussian surface 406. Furthermore, A is chosen such that $$\int_\Omega A/D_x dx = 1,$$

where $\Omega$ is the Gaussian surface 406.

Additionally, the variance in the estimated capacitance can be further reduced by breaking up the Gaussian surface 406 into a plurality of disjoint strata, and choosing locations in each stratum separately, such that the variance of the dot product of the normal vector and the electric-field Green's function is as little as possible in each stratum.

Figure 5:
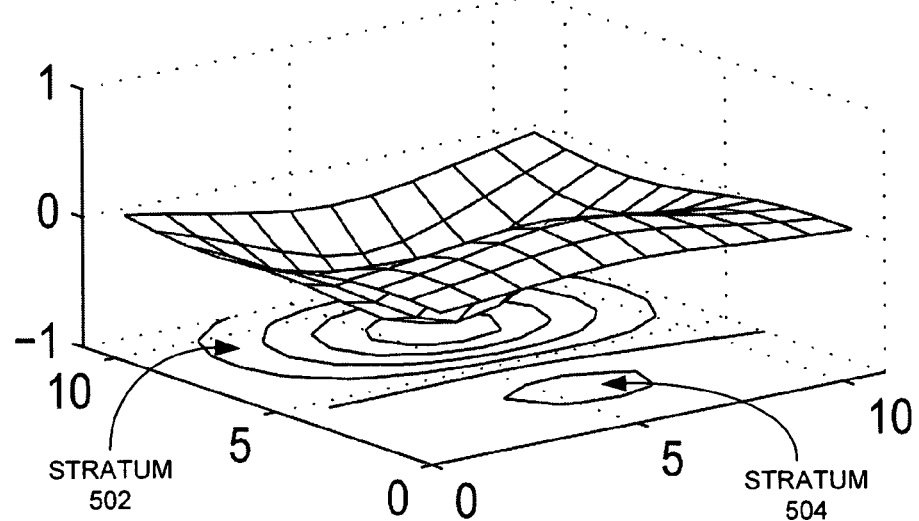
FIG. 5 presents a three-dimensional plot that illustrates the variation of the dot product of the normal vector and the electric-field Green's function over the face of a dielectric cube in accordance with an embodiment of the present invention.

In one embodiment of the present invention, the dot product of the normal vector and the electric-field Green's function is computed for a plurality of Green's functions in the computed Green's function archive. FIG. 5 presents a three-dimensional plot that illustrates the variation of the dot product of the normal vector and the electric-field Green's function on one of the face of a dielectric cube.

Next, the cross product of points on the Gaussian surface and points on the surface of the first hop cube is divided into multiple strata, such that the variance of the dot product of the normal vector and the electric-field Green's function is as little as possible in each stratum. For example, strata 502 and 504 are sections of the surface of the first hop cube in which there is very little variance in the dot product of the normal vector and the electric-field Green's function. Next, a stratum-specific parasitic capacitance is estimated for each stratum by estimating the electric field at a plurality of locations in each stratum. Next, the parasitic capacitance is estimated by combining the stratum-specific parasitic capacitance estimates.

Note that, by using a statistical method for estimating the parasitic capacitance, the present invention overcomes the scalability problems that afflict other non-statistical approaches.

Additionally, the present invention uses a set of Green's functions that correspond to the various dielectric compositions that are encountered while estimating the capacitance. This accelerates the capacitance estimation process because it allows the use of larger cube sizes that span multiple dielectric layers.

Furthermore, the present invention significantly reduces the variance of the estimated capacitance by (a) judiciously choosing the Gaussian surface, (b) sampling the Gaussian surface using a probability distribution function that mimics the behavior of the dot product of the normal vector and the electric-field Green's function, and (c) dividing the cross product of points on Gaussian surface and points on surface of first hop cube into multiple strata, so that the variation of the dot product of the normal vector and the electric-field Green's function is minimized within each stratum. In the absence of these variance reduction techniques, the capacitance estimate would have had a higher variance, which would have been detrimental to subsequent timing or signal integrity analyses.

Process of Pre-Computing and Archiving a Set of Green's Functions

FIG. 7 presents a flowchart that illustrates the process of pre-computing and archiving a set of Green's functions for a plurality of locations. The process begins with reading the technology file (step 702). As was mentioned before, the technology file contains information that describes the composition of a vertical cross-section of an integrated circuit.

Next, a set of dielectric configurations are identified based on the information contained in the technology file (step 704).

Next, an optimal discretization count is determined for each dielectric configuration (step 706). By using an optimal discretization count, the present invention strikes a balance between the amount of processing time and the amount of memory required for computing the Green's functions. The system then pre-computes Green's functions for each dielectric configuration (step 708).

Note that, a Green's function is an integration kernel that can be used to solve an inhomogeneous differential equation with boundary conditions. The exact form of the Green's function depends on the differential equation, the surface shape, and the type of boundary conditions. In the present invention, each Green's function is specific to a particular dielectric composition of a cube.

Furthermore, in the present invention, multiple Green's functions are identified, so that they correspond to the various dielectric compositions that are encountered while estimating the capacitance. In one embodiment of the present invention, the identified set of Green's functions forms a canonical set of Green's functions for the processing technology that is described in the technology file.

Finally, the pre-computed set of Green's functions are archived in a library (step 710). By doing this, the present invention allows a capacitance estimation process to lookup the pre-computed Green's functions that corresponds to the dielectric configurations present in the fabrication technology, which can be identified based on information contained in the technology file. In one embodiment of the present invention, the library that contains the pre-computed set of the Green's functions is stored as a binary file.

Note that, the set of Green's functions are selected solely based on information contained in the technology file. As a result, the same set of Green's functions can be re-used for estimating the capacitance for a number of integrated circuits with differing geometries as long as these integrated circuits are fabricated using the same technology.

Furthermore, pre-computing Green's functions allow a capacitance estimation process to quickly lookup an applicable Green's function, thereby significantly speeding up the process of estimating capacitance.

CONCLUSION

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

Specifically, it will be apparent to one skilled in the art that, the present invention can be used to estimate the capacitance for any three-dimensional structure that is composed of conductors and dielectrics. For example, the present invention can be used to compute the capacitance of electronic devices, CCD (Charge-Coupled Device) displays, A/D (Analog-to-Digital) circuits, etc.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

What is claimed is:

1. A method for estimating a parasitic capacitance, the method comprising:
   receiving an integrated circuit design and a set of Green's functions; and
   choosing a conductor within the integrated circuit;
   constructing a Gaussian surface that contains the conductor, but does not contain any other conductor;
   selecting a set of locations on the Gaussian surface; and
   estimating the electric field at each location in the set of locations, wherein estimating the electric field at a location involves:
   constructing a first closed surface that encloses the location, wherein the first closed surface can touch a conductor, but cannot contain a conductor, and wherein the dielectric composition of the first closed surface corresponds to a dielectric configuration for which an electric field Green's function is available in the pre-computed set of Green's functions;
   estimating the electric potential at one or more locations on the first closed surface;
   estimating the electric field at each location in the set of locations from the estimated electric potential; and
   estimating the parasitic capacitance from the estimated electric field at each location in the set of locations.

2. The method of claim 1,
   wherein estimating the electric potential at one or more locations on the first closed surface involves:
   constructing a second closed surface that encloses a location on the first closed surface,
      wherein the second closed surface can touch a conductor, but cannot contain a conductor, and
      wherein the dielectric composition of the second closed surface corresponds to a dielectric configuration for which an electric-potential Green's function is available in the pre-computed set of Green's functions; and
   estimating the electric potential at one or more locations on the second closed surface.

3. The method of claim 2, wherein the second closed surface is a second cube.

4. The method of claim 1, wherein the method comprises representing the integrated circuit design using an oct-tree variant that only allows two-way node splits, thereby facilitating efficient execution of geometric queries without using a large amount of storage space.

5. The method of claim 1, wherein selecting the set of locations on the Gaussian surface involves selecting a first location, wherein the first location's distance from the first conductor is substantially equal to the first location's distance from a neighboring conductor.

6. The method of claim 1, wherein selecting the set of locations on the Gaussian surface involves selecting a first location, wherein the first location is selected using a probability distribution function that mimics the behavior of a dot product between a normal vector of the Gaussian surface and an eletric field.

7. The method of claim 1, wherein selecting the set of locations on the Gaussian surface involves selecting a first location, wherein the first location is selected by:
   stratifying a cross product of points on the Gaussian surface and points on the first closed surface into multiple strata, so that the variation in the value of a dot product between a normal vector and a Green's function is minimized within each stratum; and
   selecting the first location from a stratum.

8. The method of claim 1, wherein the first closed surface is a first cube.

9. A computer-readable storage medium storing instructions that when executed by a computer cause the computer to perform a method for estimating a parasitic capacitance, the method comprising:
   receiving an integrated circuit design and a set of Green's functions; and
   choosing a conductor within the integrated circuit;
   constructing a Gaussian surface that contains the conductor, but does not contain any other conductor;
   selecting a set of locations on the Gaussian surface; and
   estimating the electric field at each location in the set of locations, wherein estimating the electric field at a location involves:
   constructing a first closed surface that encloses the location, wherein the first closed surface can touch a conductor, but cannot contain a conductor, and wherein the dielectric composition of the first closed surface corresponds to a dielectric configuration for which an electric-field Green's function is available in the pre-computed set of Green's functions;

estimating the electric potential at one or more locations on the first closed surface;
estimating the electric field at each location in the set of locations from the estimated electric potential; and
estimating the parasitic capacitance from the estimated electric field at each location in the set of locations.

10. The computer-readable storage medium of claim 9, wherein estimating the electric potential at one or more locations on the first closed surface involves:
constructing a second closed surface that encloses a location on the first closed surface,
wherein the second closed surface can touch a conductor, but cannot contain a conductor, and
wherein the dielectric composition of the second closed surface corresponds to a dielectric configuration for which an electric-potential
Green's function is available in the pre-computed set of Green's functions; and
estimating the electric potential at one or more locations on the second closed surface.

11. The computer-readable storage medium of claim 10, wherein the second closed surface is a cube.

12. The computer-readable storage medium of claim 9, wherein the method comprises representing the integrated circuit design using an oct-tree variant that only allows two-way node splits, thereby facilitating efficient execution of geometric queries without using a large amount of storage space.

13. The computer-readable storage medium of claim 9, wherein selecting the set of locations on the Gaussian surface involves selecting a first location, wherein the first location's distance from the first conductor is substantially equal to the first location's distance from a neighboring conductor.

14. The computer-readable storage medium of claim 9, wherein selecting the set of locations on the Gaussian surface involves selecting a first location, wherein the first location is selected using a probability distribution function that mimics the behavior of a dot product between a normal vector and an electric field.

15. The computer-readable storage medium of claim 9, wherein selecting the set of locations on the Gaussian surface involves selecting a first location, wherein the first location is selected by:
stratifying a cross product of points on the Gaussian surface and points the first closed surface into multiple strata, so that the variation in the value of a dot product between a normal vector and a Green's function is minimized within each stratum; and
selecting the first location from a stratum.

16. The computer-readable storage medium of claim 9, wherein the first closed surface is a cube.

17. An apparatus for estimating parasitic capacitance, the apparatus comprising:
a receiving mechanism configured to receive an integrated circuit design and a set of Green's functions; and
an estimating mechanism configured to estimate a parasitic capacitance by:
choosing a conductor within the integrated circuit;
constructing a Gaussian surface that contains the conductor, but does not contain any other conductor;
selecting a set of locations on the Gaussian surface; and
estimating the electric field at each location in the set of locations, wherein estimating the electric field at a location involves:
constructing a first closed surface that encloses the location, wherein the first closed surface can touch a conductor, but cannot contain a conductor, and wherein the dielectric composition of the first closed surface corresponds to a dielectric configuration for which an electric-field Green's function is available in the pre-computed set of Green's functions;
estimating the electric potential at one or more locations on the first closed surface;
estimating the electric field at each location in the set of locations from the estimated electric potential; and
estimating the parasitic capacitance from the estimated electric field at each location in the set of locations.

18. The apparatus of claim 17, wherein while estimating the electric potential at the one or more locations on the first closed surface, the estimating mechanism is configured to:
construct a second closed surface that encloses a location on the first closed surface, wherein the second closed surface can touch a conductor, but cannot contain a conductor, and wherein the dielectric composition of the second closed surface corresponds to a dielectric configuration for which an electric-potential Green's function is available in the pre-computed set of Green's functions; and
estimate the electric potential at one or more locations on the second closed surface.

19. The apparatus of claim 18, wherein the first closed surface is a first cube.

20. The apparatus of claim 17, wherein the apparatus is configured to represent the integrated circuit design using an oct-tree variant that only allows two-way node splits, thereby facilitating efficient execution of geometric queries without using a large amount of storage space.

21. The apparatus of claim 17, wherein while selecting the set of locations on the Gaussian surface, the estimating mechanism is configured to select a first location, wherein the first location's distance from the first conductor is substantially equal to the first location's distance from a neighboring conductor.

22. The apparatus of claim 17, wherein while selecting the set of locations on the Gaussian surface, the estimating mechanism is configured to select a first location, wherein the first location is selected using a probability distribution function that mimics the behavior of a dot product between a normal vector and an electric field.

23. The apparatus of claim 17, wherein while selecting the set of locations on the Gaussian surface, the estimating mechanism is configured to select a first location, wherein the first location is selected by:
stratifying a cross product of points on the Gaussian surface and points on the first closed surface into multiple strata, so that the variation in the value of a dot product between a normal vector and a Green's function is minimized within each stratum; and
selecting the first location from a stratum.

24. The apparatus of claim 17, wherein the first closed surface is a first cube.

* * * * *